United States Patent
Lai et al.

(10) Patent No.: US 7,893,853 B2
(45) Date of Patent: Feb. 22, 2011

(54) DAC VARIATION-TRACKING CALIBRATION

(75) Inventors: Fang-Shi Jordan Lai, Chia Yi (TW);
 Kuo-Ming Wang, Hsin-Chu (TW);
 Hsu-Feng Hsueh, Tainan (TW); Cheng Yen Weng, Hsin-Chu (TW); Yung-Fu Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 12/347,014

(22) Filed: Dec. 31, 2008

(65) Prior Publication Data

US 2010/0164766 A1  Jul. 1, 2010

(51) Int. Cl.
 *H03M 1/10* (2006.01)
(52) U.S. Cl. .................. 341/120; 341/144; 341/145
(58) Field of Classification Search .................. 341/120, 341/135, 136, 144, 145
 See application file for complete search history.

(56) References Cited

U.S. PATENT DOCUMENTS

| | | | |
|---|---|---|---|
| 5,703,586 A * | 12/1997 | Tucholski | 341/144 |
| 5,949,362 A * | 9/1999 | Tesch et al. | 341/144 |
| 6,489,905 B1 * | 12/2002 | Lee et al. | 341/120 |
| 6,501,402 B2 * | 12/2002 | Boxho | 341/120 |
| 6,650,265 B1 * | 11/2003 | Bugeja | 341/144 |
| 6,738,000 B2 * | 5/2004 | Boxho | 341/120 |
| 7,026,971 B2 * | 4/2006 | Horsky et al. | 341/145 |
| 7,076,384 B1 * | 7/2006 | Radulov et al. | 702/85 |
| 2007/0252742 A1 | 11/2007 | Shiu et al. | |

OTHER PUBLICATIONS

Cong, Y., et al., "A 1.5V 14b 100MS/s Self-Calibrated DAC," IEEE International Solid-State Circuits Conference, Feb. 11, 2003, 10 pgs.
Chen, H.-H., et al., "A 14-b 150 MS/s CMOS DAC with Digital Background Calibration," Symposium on VLSI Circuits Digest of Technical Papers, 2006, 2 pgs.

* cited by examiner

*Primary Examiner*—Khai M Nguyen
(74) *Attorney, Agent, or Firm*—Slater & Matsil, L.L.P.

(57) ABSTRACT

A method of calibrating a digital-to-analog converter (DAC) is provided. The DAC includes a least-significant bit (LSB) block, and dummy LSB block adjacent to the LSB block. The DAC has a most-significant bit (MSB) block, which includes MSB thermometer macros. The method includes measuring the dummy LSB block to obtain a dummy LSB sum; and calibrating the MSB block so that each of the MSB thermometer macros provides a substantially same current as the dummy LSB sum.

19 Claims, 4 Drawing Sheets

DAC VARIATION-TRACKING CALIBRATION

TECHNICAL FIELD

This invention relates generally to digital-to-analog converters, and more specifically to the structures of digital-to-analog converters and the methods for calibrating the same.

BACKGROUND

Data converters, for example, digital-to-analog converters (DAC) and analog-to-digital converters (ADC), are ubiquitous in applications involving digital signal processing of real-world signals such as those found in communication systems, instrumentation, and audio and video processing systems.

Two major issues for DAC design are monotonicity and resolution. Monotonicity means that as the digital value becomes greater, the converted analog value must also become greater. Many DAC building blocks require guaranteed monotonicity with moderate clock rate and moderate design complexity. Examples include a DAC in a digitally controlled oscillator within the PLL loop, or a DAC in a digitally controlled crystal oscillator in an automatic frequency control loop. The matching between different DAC elements is usually required to guarantee monotonic behavior. With the scaling down of integrated circuit manufacturing processes, the physical sizes of the DAC elements becomes smaller, and it is therefore more difficult to control the sizes of DAC elements, which must be matched to achieve monotonicity. As a result, the physical sizes of the DAC elements are limited by the matching requirement, thus the DAC does not benefit from the process scaling.

One type of DAC that has guaranteed monotonicity is a thermometer DAC. It is so named because it is similar to a mercury thermometer, where the mercury column always rises to the appropriate temperature and no mercury is present above that temperature. Typically, the input digital signal is binary and the binary code is converted to a thermometer code. The thermometer code is then used to control thermometer elements to generate an analog signal. For a thermometer DAC, elements are all of the same size, so that element matching becomes much simpler than in the binary case. Considering the transfer function, the thermometer converter is monotonic by design. This is because that when the input value increases, the bits change from 0 to 1 only. The requirement on element matching is hence relaxed in the thermometer DAC and the monotonicity is guaranteed.

In conventional DACs, thermometer coding may be combined with binary coding to achieve the digital-to-analog conversion for any digital number within the conversion range. For example, for a 12-bit DAC, the 12 bits are divided into 6 most-significant bits (MSB) and 6 least-significant bits (LSB). The MSBs are converted to a 63-bit thermometer code, with each bit (thermometer bits) corresponding to one of the macros. Each of the macros is capable of providing a current corresponding to 64 times the unit current, wherein the unit current is the current representing the lowest bit of the LSB. Each of the MSB macros thus needs to provide exactly 64 times the unit current. Accordingly, the MSB macros need to be calibrated.

Conventionally, the calibration of a DAC was performed at the power-on time of the DAC. In the calibration process, the total current (known as LSB sum) that can be provided by the LSB bits is measured. In the above-discussed example, the LSB sum should be a value close to 64 times the unit current, with a possible slight variation. The measured LSB sum is then used to calibrate each of the MSB thermometer bits, so that the current provided by each of the MSB bits equals the LSB sum.

The conventional calibration process, however, suffers from drawbacks. During the usage of the DAC, temperature and voltage induced variations may occur, and the LSB sum may drift away. As a result, each of the MSB bits may no longer provide the same current as the drifted LSB sum. The monotonicity between LSB and MSB is hence no longer maintained. Therefore, new calibration methods are needed to solve the above-discussed problems.

SUMMARY OF THE INVENTION

In accordance with one aspect of the present invention, a method of calibrating a digital-to-analog converter (DAC) is provided. The DAC includes a least-significant bit (LSB) block, and dummy LSB block adjacent to the LSB block. The DAC has a most-significant bit (MSB) block, which includes MSB thermometer macros. The method includes measuring the dummy LSB block to obtain a dummy LSB sum; and calibrating the MSB block so that each of the MSB thermometer macros provides a substantially same current as the dummy LSB sum.

In accordance with another aspect of the present invention, in a method of calibrating a DAC, the DAC is first provided. The DAC includes an LSB block; a dummy LSB block adjacent to the LSB block; and an MSB block having MSB thermometer macros. The method includes measuring the LSB block to obtain an LSB sum; and measuring the dummy LSB block to obtain a first dummy LSB sum. In the case, the first dummy LSB sum is not equal to the LSB sum, the dummy LSB block is calibrated so that a second dummy LSB sum of the dummy LSB block equals the LSB sum. The MSB block is calibrated so that each of the MSB thermometer macros provides a substantially same current as the LSB sum. After the step of calibrating the MSB block, the dummy LSB block is measured to obtain a third dummy LSB sum. The MSB block is then calibrated so that each of the MSB thermometer macros provides a substantially same current as the third dummy LSB sum.

In accordance with yet another aspect of the present invention, a DAC includes an LSB block; and a dummy LSB block adjacent to the LSB block. The dummy LSB block is configurable, and hence the dummy LSB sum of the dummy LSB block can be adjusted to substantially equal to the LSB sum, which fluctuates with the process, temperature, and voltage variations.

The advantageous features of the present invention include improved performance in DAC due to continuous calibration of MSB bits and continuous tracking of the LSB sum variations. The embodiments of the present invention thus suffer less from the process, voltage, and temperature variations.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel digital-to-analog converter (DAC) embodiment and calibration methods for calibrating the same are provided. The variations of the embodiment are discussed. Throughout the various views and illustrative embodiments of the present invention, like reference numbers are used to designate like elements.

In the following discussion, unless specified otherwise, a 14-bit DAC, which may be divided into 7 most-significant bits (MSB) and 7 least-significant bits (LSB), is used as an example to explain the concept of the present invention. The present invention, however, may be applied to DACs with any number of bits, and the MSB bits and LSB bits may be divided differently, for example, into 6 MSB bits and 8 LSB bits. The MSB bits are converted to, and represented by, an MSB thermometer code, which has 128 bits (referred to as MSB thermometer bits hereinafter) if the number of MSB bits is 7. The LSB bits, on the other hand, may be represented in a thermometer style, with the LSB bits also converted to, for example, 128 thermometer bits. Alternatively, the LSB bits may be represented in a binary style using two ×1 unit cells, one ×2 unit cell, one ×4 unit cell, one ×8 unit cell . . . and one ×64 unit cell, indicating that the corresponding unit cells are capable of providing 1 time, 2 times, 4 times, 8 times . . . and 64 times unit current, respectively. The unit current represents the lowest bit of the LSB bits.

Figure 1:
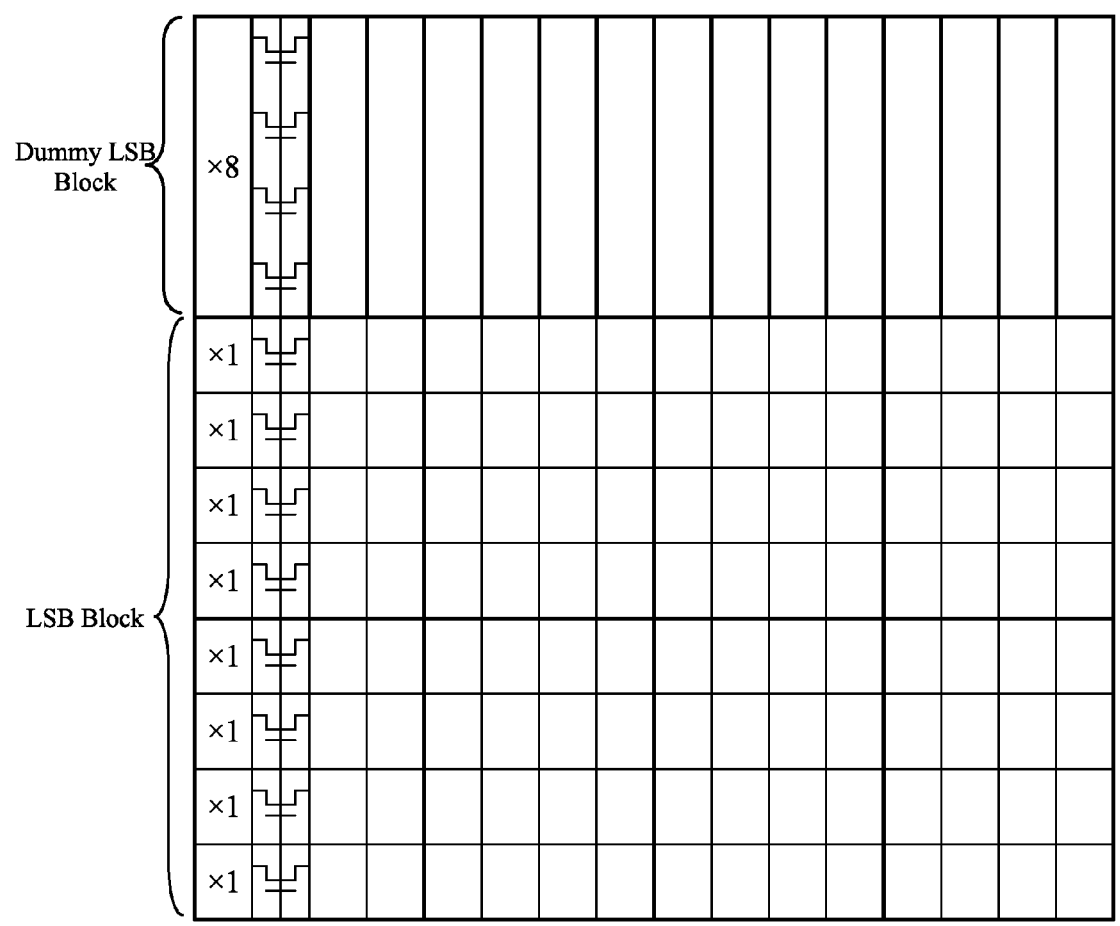
FIG. 1 illustrates an embodiment of the present invention including a least-significant bit (LSB) block and a dummy LSB block of a digital-to-analog converter (DAC)

FIG. 1 illustrates an embodiment of the present invention. A DAC circuit includes an LSB block and an LSB dummy block. The LSB block includes unit cells that provide currents for LSB bits. In an exemplary embodiment as shown in FIG. 1, the LSB bits are converted to a thermometer code, and are represented by 128 unit cells (each being a ×1 unit cell) that may be formed as an array. Although only one column of grids is illustrated as having transistors, each of the grids in the LSB block is actually identical to others. Each of the 128×1 unit cells corresponds to one of the thermometer bits. Therefore, the LSB block can provide up to 128 times (or 127 times) the unit current. In the following discussion, the total current provided by the LSB block is referred to as an LSB sum. Accordingly, the LSB sum, as designed, is expected to be 128 although it may drift away in real situation. In alternative embodiments, the LSB bits are implemented in a binary style. In an exemplary embodiment, the LSB block includes two ×1 unit cells, a ×2 unit cell, a ×4 unit cell, a ×8 unit cell . . . and a ×64 unit cell. In other embodiments, the LSB block may have any other applicable design. The LSB block and an MSB block (refer to FIG. 4) contribute to the analog signal as the result of the D-A conversion, for example, a current.

The DAC circuit further includes a dummy LSB block laid out adjacent to the LSB block. In the preferred embodiment, the dummy LSB block is closely located to the LSB block with no other circuit therebetween. More preferably, the dummy LSB block is physically as close to the LSB block as possible. The dummy LSB block is capable of providing a total current substantially equal to the LSB sum. It is noted that since the currents are analog signals, the currents may not be exactly equal to each other. Throughout the specification, when a current is referred to as being "equal to" another current or a current sum, it may mean that they are substantially equal to each other with the difference less than a half the unit current represented by the lowest bit of the LSB (which means that their digital representations are the same). In other words, the dummy LSB block is capable of providing a dummy LSB sum equal to the LSB sum. However, the dummy LSB block does not contribute to the current that is the result of the D-A conversion, unlike the LSB block.

In an embodiment, the dummy LSB block may copy the layout of the LSB block, so that they have the identical structures. In alternative embodiments, the dummy LSB block may have different design and layout than the LSB block so that it may occupy a smaller chip area than the LSB block, but can still provide a dummy LSB sum equal to the LSB sum. This may be achieved, for example, by forming ×4, ×8 unit cells (instead of ×1 unit cells) and the like, and by adjusting the W/L ratios of the unit cells to reduce their sizes, wherein the W/L ratios are the gate-width to gate-length ratio of transistors in the unit cells.

FIG. 1 also shows that the gates of the unit cells in the dummy LSB block and the LSB block may be interconnected, so that they are operated under a same reference voltage. Advantageously, if there is any drift in the reference voltage, which causes a drift of the dummy LSB sum and a drift of the LSB sum, the drift of the dummy LSB sum and the drift of the LSB sum are expected to be in a same direction, and hopefully remain substantially equal to each other.

Figure 2:
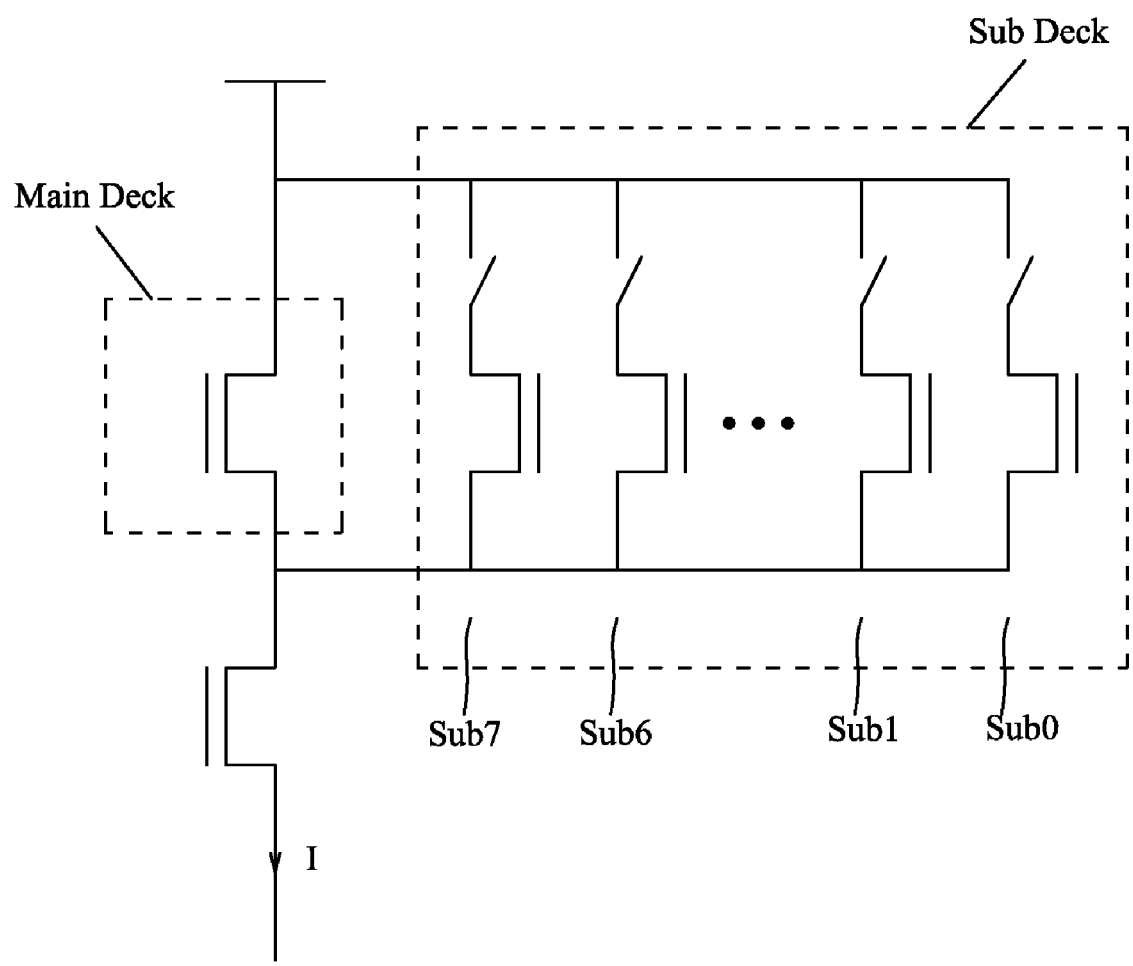
FIG. 2 illustrates a configurable block including a main deck and a configurable sub deck, wherein the configurable block may be used for most-significant bits (MSBs) and/or the dummy LSB block.

Although the dummy LSB block is designed so that the dummy LSB sum may equal to the LSB sum, due to process, voltage, and temperature variations (particularly process variations), the measured dummy LSB sum may not be equal to the LSB sum. The dummy LSB block thus needs a calibration. FIG. 2 illustrates a portion of an exemplary circuit diagram of the dummy LSB block showing how the dummy LSB block may be calibrated. The dummy LSB block includes a main deck that may provide a sum coarsely matching, but less than, the LSB sum, and a configurable sub deck for fine tuning the dummy LSB sum to match the LSB sum more accurately. The main deck is symbolized by a transistor, which may actually include a plurality of unit cells in the dummy LSB block, with the plurality of unit cells interconnected to each other to provide a high current. In an exemplary embodiment, the main deck provides a sum of 124 (a total current equal to 124 times the unit current). The sub deck, on the other hand, includes unit cells sub0 and sub7, and is capable of providing 16 times the unit current. At the power-on time of the respective DAC circuit, the sub deck is such designed that it only provides eight times the unit current, so that the total sum of the main deck and the sub deck is 128. After the sum of the LSB block and the sum of the dummy LSB block are measured, if the dummy LSB sum is greater than the LSB sum, the sub deck is configured, so that fewer unit cells in the sub deck are turned on until the sum of the dummy LSB matches the sum of the LSB. If however, the dummy LSB sum is less than the LSB sum, the sub deck is configured, and more unit cells in the sub deck are turned on until the sum of the dummy LSB matches the sum of the LSB. It is noted that the sub deck may be in the thermometer style including eight ×1 unit cells, or in the binary style including for example, two ×1 unit cells, a ×2 unit cell, and a ×4 unit cell. It is appreciated that the numbers provided in the above-discussion are merely examples, and may be changed for different DAC design.

After the dummy LSB is calibrated, the dummy LSB sum substantially matches the LSB sum. Since the dummy LSB block is closely located to the LSB block, it is expected that if any variation (particularly temperature and voltage variations) occurs to cause the LSB sum to drift, the dummy LSB sum also drifts in a same direction to match the LSB sum, so that the difference between the dummy LSB sum and the LSB sum remains to be insignificant. In other words, the dummy LSB sum mirrors the LSB sum. Therefore, in the operation of the DAC, the dummy LSB sum may be measured to determine the LSB sum. This is particularly desirable when the DAC is in use, and the LSB sum cannot be measured directly.

Figure 3:
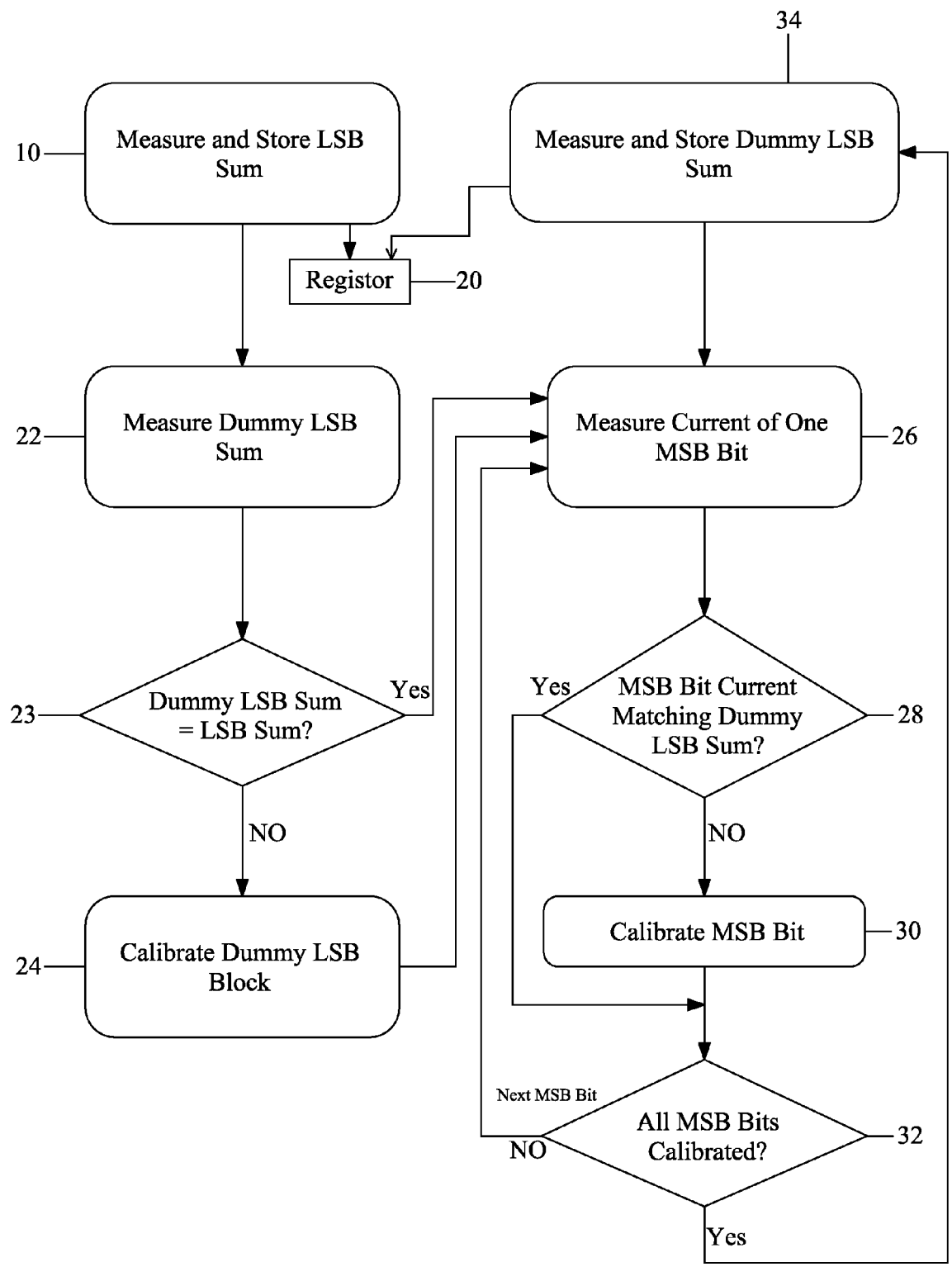
FIG. 3 illustrates a flow chart of a DAC calibrating process.

FIG. 3 illustrates a flow chart of a DAC calibration process. After the DAC circuit is powered on (step 10), the LSB sum is measured and stored in register 20. Next, the dummy LSB sum is measured, as is shown in step 22, and compared to the LSB sum (step 23). The dummy LSB sum may, or may not, be equal to the LSB sum. In the case the dummy LSB sum is not equal to the LSB sum, a dummy block calibration is performed so that the dummy LSB sum is equal to the LSB sum (step 24). The calibration may be performed using the structure and steps as shown in FIG. 2. If, however, the dummy LSB sum is equal to the LSB sum, the calibration step may be skipped, and step 26 is performed. Steps 20, 22, 23, and 24 may be foreground steps, and are preferably performed before the DAC is put into use. Alternatively, steps 20, 22, 23, and 24 may be background steps that do not interfere with the using of the DAC.

Next, as shown in step 26, a current of a first MSB thermometer bit is measured. The current is compared to the LSB sum that is stored in the register (step 28). If the current of the first MSB thermometer bit is not equal to the LSB sum, an MSB-bit calibration (step 30) is performed until the first MSB thermometer bit provides a current equal to the LSB sum. The macro of the first MSB thermometer bit (and all of the other MSB thermometer bits) may also be illustrated using the circuit diagram shown in FIG. 2. However, the layout of the MSB thermometer macros may be different from that of the dummy LSB block. Again, each of the MSB thermometer macros may include a main deck and a configurable sub deck. If however, the current of the first MSB thermometer bit is equal to the LSB sum, step 30 is skipped, and a checking (step 32) is performed to find out whether the current MSB thermometer bit is the last bit of the MSB thermometer array. Since the current bit is the first MSB thermometer bit, the process flow goes back to step 26 to check the second MSB thermometer bit (please also refer to FIG. 4). By looping through steps 26, 28, 30 and 32, all of the MSB thermometer bits are measured and calibrated against the LSB sum stored in register 28.

After all of the 128 MSB thermometer bits have been measured and calibrated, the process proceeds to step 34. In step 34, the dummy LSB block is measured again. It is appreciated that from the time step 22 is performed to the time step 34 is performed, the LSB sum may drift away from the original value, for example, as a result of the voltage and temperature variations. However, since the LSB block may be in use for the D-A conversion, it is infeasible and undesirable to measure the LSB sum. As discussed in the preceding paragraphs, the dummy LSB sum mirrors the LSB sum, and hence by measuring the dummy LSB sum, the LSB sum is known. The new dummy LSB sum (which is equal to the new LSB sum) is saved into register 20 to replace the LSB sum stored in step 10. Next, steps 26, 28, 30 and 32 are performed again to measure and calibrate the currents of MSB thermometer bits. In this step, however, the MSB thermometer bits are calibrated against the dummy LSB sum.

It is noted that steps 26, 28, 30, 32, and 34 also form a loop, in which the dummy LSB sum is measured and all of the MSB thermometer bits are calibrated according to the newly measured dummy LSB sum. This loop is performed in a background process that preferably continuously runs as long as the power of the DAC circuit is on. Through such a background calibration, the monotonicity between the LSB and the MSB is maintained regardless of the temperature and voltage variations.

Figure 4:
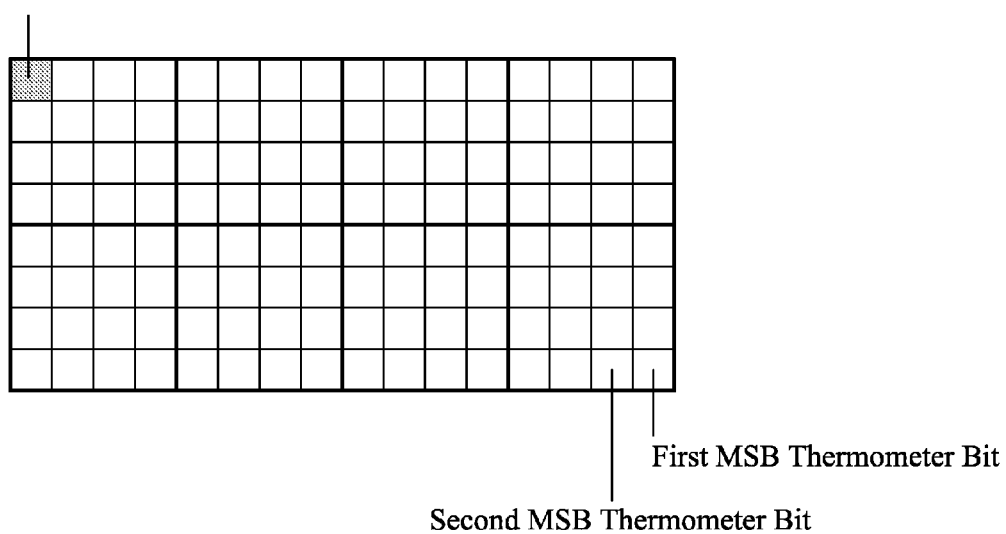
FIG. 4 illustrates a diagram of a most-significant bit (MSB) block formed of an array of thermometer bits (macros).

Referring to FIG. 4, the MSB thermometer includes a backup bit. The resulting MSB thermometer bit array thus includes only 127 bits that may contribute to the current as the result of the D-A conversion. Since the background calibration loops through all of the MSB thermometer bits, inevitably, it may occur that when an MSB thermometer bit is measured and calibrated, the same MSB thermometer bit is also needed for the D-A conversion, and needs to be turned on. For example, in FIG. 4, the D-A conversion may require the first and the second MSB thermometer bits to be turned on, while the background calibration process is also performing calibration to the second MSB bit at the same time. In this case, the second MSB bit may be disconnected from the current path of the D-A conversion, while the backup MSB thermometer bit is connected into the current path to provide a current for the second MSB thermometer bit. In this case, there are still two MSB thermometer bits providing currents, and the D-A conversion is not affected.

The embodiments of the present invention include several advantageous features. By performing the calibration process, the MSB thermometer bits are dynamically calibrated to compensate for the process, voltage, and temperature variations, which cause the drift in the LSB sum. The performance and the monotonicity of the DAC are thus improved. Such a continuous calibration, however, does not interrupt the D-A conversion.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of calibrating a digital-to-analog converter (DAC), the method comprising:
   providing the DAC comprising:
      a least-significant bit (LSB) block;
      a dummy LSB block adjacent to the LSB block; and
      a most-significant bit (MSB) block comprising MSB thermometer macros;
   measuring the LSB block to obtain an LSB sum;
   measuring the dummy LSB block to obtain a first dummy LSB sum;

calibrating the dummy LSB block so that a second dummy LSB sum of the dummy LSB block equals the LSB sum; and calibrating the MSB block so that each of the MSB thermometer macros provides a substantially same current as the second dummy LSB sum.

2. The method of claim 1 further comprising repeating steps starting from the step of measuring the dummy LSB block to, and comprising, the step of calibrating the MSB block.

3. The method of claim 2, wherein the step of measuring the dummy LSB block and the step of calibrating the MSB block are performed by a background process.

4. The method of claim 1, wherein the step of calibrating the dummy LSB block is performed before the step of measuring the dummy LSB block to obtain the first dummy LSB sum and the step of calibrating the MSB block.

5. The method of claim 1, wherein the first dummy LSB sum is different from the second dummy LSB sum.

6. The method of claim 1, wherein the MSB block comprises a backup MSB thermometer macro and a plurality of MSB thermometer macros, and wherein the method further comprises in a step of calibrating one of the MSB thermometer macros, turning on the backup MSB thermometer macro to provide a current for the one of the MSB thermometer macros.

7. The method of claim 1, wherein the LSB block does not comprise any configurable sub deck, and wherein the dummy LSB block comprises a configurable sub deck.

8. A method of calibrating a digital-to-analog converter (DAC), the method comprising:
    providing the DAC comprising:
        a least-significant bit (LSB) block;
        a dummy LSB block adjacent to the LSB block; and
        a most-significant bit (MSB) block comprising MSB thermometer macros;
    measuring the LSB block to obtain an LSB sum;
    measuring the dummy LSB block to obtain a first dummy LSB sum;
    calibrating the dummy LSB block so that a second dummy LSB sum of the dummy LSB block equals the LSB sum;
    calibrating the MSB block so that each of the MSB thermometer macros provides a substantially same current as the LSB sum;
    after the step of calibrating the MSB block, measuring the dummy LSB block to obtain a third dummy LSB sum; and
    calibrating the MSB block so that each of the MSB thermometer macros provides a substantially same current as the third dummy LSB sum.

9. The method of claim 8, wherein the third dummy LSB sum is different from the second dummy LSB sum.

10. The method of claim 8 further comprising, throughout an entirety of a period the DAC is powered on, repeating the step of measuring the dummy LSB block to obtain the third dummy LSB sum to, the step of calibrating the MSB block so that each of the MSB thermometer macros provides the substantially same current as the third dummy LSB sum, and steps therebetween.

11. The method of claim 10, wherein the step of repeating is performed by a background process.

12. The method of claim 10, wherein during the step of repeating, the dummy LSB block is not calibrated.

13. The method of claim 10, wherein during the step of repeating, the LSB block is not calibrated.

14. A digital-to-analog converter (DAC) comprising:
    a least-significant bit (LSB) block, wherein currents generated by the LSB block are comprised in an analog signal converted by the DAC from a digital signal; and
    a dummy LSB block laid out adjacent to the LSB block, wherein a dummy LSB sum of the dummy LSB block is configurable, and wherein currents generated by the dummy LSB block are not comprised in the analog signal.

15. The DAC of claim 14, wherein the dummy LSB block comprises a main deck, and a configurable sub deck connected to the main deck, and wherein the dummy LSB sum is configurable in a range between a first value greater than an LSB sum of the LSB block and a second value less than the LSB sum.

16. The DAC of claim 14, wherein the LSB block comprises no configurable sub deck.

17. The DAC of claim 14, wherein the dummy LSB block and the LSB block have a same layout.

18. The DAC of claim 14, wherein the dummy LSB block and the LSB block have different layouts.

19. The DAC of claim 14 further comprising an MSB block comprising identical thermometer macros, and wherein each of the identical thermometer macros is configurable.

* * * * *